United States Patent
Endo et al.

(10) Patent No.: US 9,299,851 B2
(45) Date of Patent: Mar. 29, 2016

(54) SEMICONDUCTOR DEVICE AND METHOD FOR MANUFACTURING THE SAME

(75) Inventors: Yuta Endo, Atsugi (JP); Toshinari Sasaki, Atsugi (JP); Kosei Noda, Atsugi (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 151 days.

(21) Appl. No.: 13/282,529

(22) Filed: Oct. 27, 2011

(65) Prior Publication Data

US 2012/0112183 A1 May 10, 2012

(30) Foreign Application Priority Data

Nov. 5, 2010 (JP) ................. 2010-248379

(51) Int. Cl.
*H01L 21/84* (2006.01)
*H01L 29/786* (2006.01)
*H01L 27/12* (2006.01)

(52) U.S. Cl.
CPC ......... *H01L 29/7869* (2013.01); *H01L 27/1225* (2013.01)

(58) Field of Classification Search
USPC .............. 257/43, 63, E29.273, E21.459, 104, 257/149, 151, 158, 159, 162
See application file for complete search history.

(56) References Cited

U.S. PATENT DOCUMENTS

| | | | |
|---|---|---|---|
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,358,766 B1* | 3/2002 | Kasahara | 438/30 |
| 6,563,174 B2 | 5/2003 | Kawasaki et al. | |
| 6,727,522 B1 | 4/2004 | Kawasaki et al. | |
| 7,015,507 B2* | 3/2006 | Yonehara et al. | 257/65 |

(Continued)

FOREIGN PATENT DOCUMENTS

| | | |
|---|---|---|
| EP | 1737044 A | 12/2006 |
| EP | 2175493 A | 4/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Bradley K Smith
*Assistant Examiner* — David Goodwin
(74) *Attorney, Agent, or Firm* — Robinson Intellectual Property Law Office; Eric J. Robinson

(57) ABSTRACT

An object is to provide a semiconductor device including an oxynitride semiconductor whose carrier density is controlled. By introducing controlled nitrogen into an oxide semiconductor layer, a transistor in which an oxynitride semiconductor having desired carrier density and on characteristics is used for a channel can be manufactured. Further, with the use of the oxynitride semiconductor, even when a low resistance layer or the like is not provided between an oxynitride semiconductor layer and a source electrode and between the oxynitride semiconductor layer and a drain electrode, favorable contact characteristics can be exhibited.

17 Claims, 15 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,268,051 B2 * | 9/2007 | Couillard et al. ............ 438/311 |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,884,360 B2 | 2/2011 | Takechi et al. |
| 7,994,508 B2 * | 8/2011 | Ye ................... 257/63 |
| 8,143,115 B2 | 3/2012 | Omura et al. |
| 8,148,721 B2 | 4/2012 | Hayashi et al. |
| 8,164,090 B2 | 4/2012 | Iwasaki et al. |
| 8,188,467 B2 | 5/2012 | Itagaki et al. |
| 8,193,045 B2 | 6/2012 | Omura et al. |
| 8,207,530 B2 * | 6/2012 | Kim et al. ............ 257/43 |
| 8,258,511 B2 * | 9/2012 | Ye ............ 257/57 |
| 8,274,078 B2 | 9/2012 | Itagaki et al. |
| 8,293,595 B2 | 10/2012 | Yamazaki et al. |
| 8,294,148 B2 | 10/2012 | Ye |
| 8,420,442 B2 | 4/2013 | Takechi et al. |
| 8,502,217 B2 | 8/2013 | Sato et al. |
| 8,841,710 B2 | 9/2014 | Yamazaki et al. |
| 8,889,480 B2 | 11/2014 | Takechi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0214042 A1 * | 11/2003 | Miyazawa ............ 257/758 |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0267633 A1 * | 11/2007 | Park et al. ............ 257/59 |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308809 A1 * | 12/2008 | Yang ............ H01L 21/02488<br>257/66 |
| 2009/0050884 A1 | 2/2009 | Ye |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 * | 5/2010 | Itagaki et al. ............ 257/43 |
| 2010/0109058 A1 | 5/2010 | Sakata et al. |
| 2010/0140611 A1 * | 6/2010 | Itagaki ............ H01L 29/7869<br>257/43 |
| 2010/0176388 A1 * | 7/2010 | Ha et al. ............ 257/40 |
| 2010/0181575 A1 * | 7/2010 | Makita et al. ............ 257/72 |
| 2010/0295037 A1 * | 11/2010 | Hironaka ............ 257/43 |
| 2010/0301340 A1 * | 12/2010 | Shih et al. ............ 257/59 |
| 2011/0140096 A1 * | 6/2011 | Kim et al. ............ 257/43 |
| 2011/0284844 A1 | 11/2011 | Endo et al. |
| 2012/0168747 A1 * | 7/2012 | Kim et al. ............ 257/43 |
| 2012/0168750 A1 | 7/2012 | Hayashi et al. |
| 2015/0056747 A1 | 2/2015 | Takechi et al. |
| 2015/0060850 A1 | 3/2015 | Yamazaki et al. |
| 2015/0084048 A1 | 3/2015 | Hayashi et al. |

FOREIGN PATENT DOCUMENTS

| | | |
|---|---|---|
| EP | 2226847 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-073563 A | 3/2007 |
| JP | 2007-096055 | 4/2007 |
| JP | 2007-123861 | 5/2007 |

(56) References Cited

FOREIGN PATENT DOCUMENTS

| | | |
|---|---|---|
| JP | 2008-042088 A | 2/2008 |
| JP | 2008-166716 A | 7/2008 |
| JP | 2008-300518 A | 12/2008 |
| JP | 2009-010362 A | 1/2009 |
| JP | 2009-135380 A | 6/2009 |
| JP | 2009-141002 A | 6/2009 |
| JP | 2009-275236 A | 11/2009 |
| JP | 2010-056546 A | 3/2010 |
| JP | 2010-093070 A | 4/2010 |
| JP | 2010-133020 | 6/2010 |
| JP | 2010-535431 | 11/2010 |
| WO | WO-2004/114391 | 12/2004 |
| WO | WO-2008/069056 | 6/2008 |
| WO | WO 2008/069255 | 6/2008 |
| WO | WO-2008/133345 | 11/2008 |
| WO | WO-2008/149754 | 12/2008 |
| WO | WO-2008/149873 | 12/2008 |
| WO | WO-2009/018509 | 2/2009 |
| WO | WO-2009/072532 | 6/2009 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystaline $InGaO_3(ZnO)5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest International Symposium Digest of Technical Papers, May 20, 2008, vol. 39, pp. 633-636.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer, ", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Techincal Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

(56) References Cited

OTHER PUBLICATIONS

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A3O3—BO Systems [A; Fe, Ga, or Al; B; Mg, Mn, Fe, Ni, Cu,or Zn]at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al.,"Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Taiwanese Office Action (Application No. 100138658), dated Nov. 20, 2015.

* cited by examiner

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

Note that the semiconductor device in this specification refers to all devices that can function by utilizing semiconductor characteristics, and electro-optic devices, semiconductor circuits, and electronic appliances are all semiconductor devices.

2. Description of the Related Art

Transistors formed over a glass substrate or the like are typically manufactured using amorphous silicon, polycrystalline silicon, or the like, as typically seen in liquid crystal display devices. Although transistors including amorphous silicon have low field-effect mobility, they can be formed over a larger glass substrate. On the other hand, although transistors including polycrystalline silicon have high field-effect mobility, they are not suitable for being formed over a larger glass substrate.

In contrast to the transistors manufactured using silicon, a technique in which a transistor is manufactured using an oxide semiconductor and applied to an electronic device or an optical device has attracted attention. For example, Patent Document 1 and Patent Document 2 each disclose a technique in which a transistor is manufactured using zinc oxide or an In—Ga—Zn—O-based oxide as an oxide semiconductor and such a transistor is used as a switching element or the like of a pixel of a display device.

In addition, Patent Document 3 discloses a technique by which an In—Ga—Zn—O-based oxide becomes oxynitride by introducing nitrogen into the film, whereby the In—Ga—Zn—O-based oxide is not only used in a transistor but can also be used as a transparent conductive film. This is because the conductance of the In—Ga—Zn—O-based oxide can be changed by introducing nitrogen thereto, according to Patent Document 3.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2010-133020

SUMMARY OF THE INVENTION

An object of one embodiment of the present invention is to provide a semiconductor device in which carrier density is controlled, or a method for manufacturing the semiconductor device.

In a transistor whose active layer is formed using an oxide semiconductor such as an In—Ga—Zn—O-based oxide semiconductor, oxygen deficiency is generated in the oxide semiconductor layer by heat treatment performed after a step of depositing the active layer, so that carrier density can be increased. However, an increase of the carrier density is difficult to control by heat treatment, and it is difficult to obtain an oxide semiconductor layer whose on characteristics are suitable for a desired semiconductor device.

In addition, in the case where a large-sized or a large-area semiconductor device using an oxide semiconductor is intended, performing heat treatment is not favorable because it causes an increase of the takt time for manufacturing and an increase of the cost.

Thus, in one embodiment of the present invention, carrier density is controlled by controlling the amount of nitrogen contained in an oxide semiconductor layer, whereby a transistor in which an oxynitride semiconductor having desired carrier density and on characteristics is used for a channel is manufactured.

In deposition by a sputtering method, the temperature of a surface where a film is deposited may be greater than or equal to 100° C. Consequently, an impurity such as water or hydrogen can be prevented from entering an object which is deposited.

The oxynitride semiconductor layer can be deposited by a method in which nitrogen or a gas containing nitrogen is introduced as a deposition gas when the oxide semiconductor layer is deposited by a sputtering method. Alternatively, the oxynitride semiconductor layer can be formed by adding nitrogen or a gas containing nitrogen, as a dopant, to the oxide semiconductor layer. As a method for adding a dopant, for example, an ion doping method or an ion implantation method can be used. Further alternatively, the oxynitride semiconductor layer can be formed by performing irradiation with plasma on the oxide semiconductor layer in a nitrogen atmosphere with the use of a dry etching apparatus, a plasma CVD apparatus, or the like.

As the structure of the transistor, a top-gate transistor or a bottom-gate transistor can be employed as appropriate. In addition, a top-contact transistor in which a semiconductor layer is provided between a source electrode and a substrate and between a drain electrode and the substrate; or a bottom-contact transistor in which a source electrode and a drain electrode are provided between a semiconductor layer and a substrate can be used as appropriate.

According to one embodiment of the present invention, a transistor in which an oxynitride semiconductor whose performance is higher than or equal to that of an oxide semiconductor is used for a channel can be manufactured.

In addition, according to one embodiment of the present invention, a semiconductor device including an oxynitride semiconductor whose carrier density is controlled can be manufactured, and sufficient on characteristics can be obtained even without heat treatment. Further, even when a low resistance layer or the like is not provided between a semiconductor layer and a source electrode and between the semiconductor layer and a drain electrode, favorable contact characteristics can be exhibited.

DETAILED DESCRIPTION OF THE INVENTION

Figure 1A:
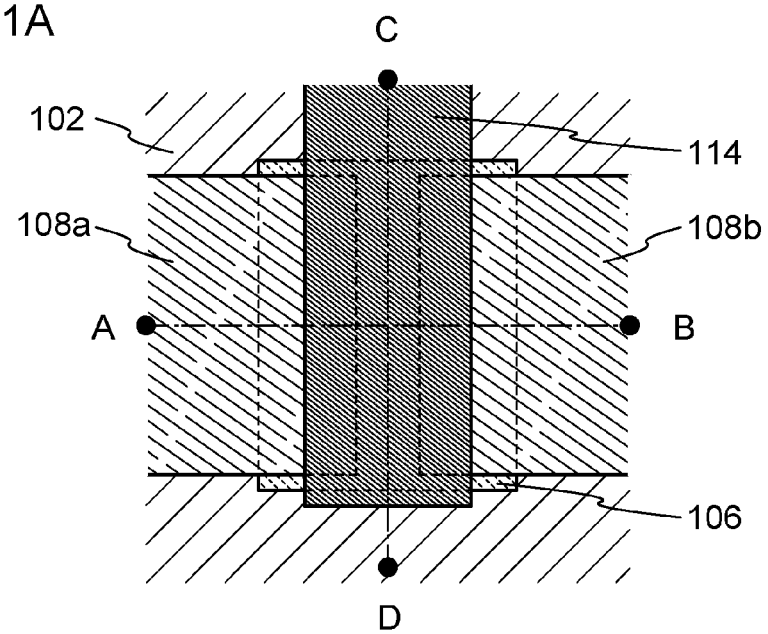
FIGS. 1A to 1C are a top view and cross-sectional views illustrating one example of a semiconductor device that is one embodiment of the present invention.

Embodiments and an example of the present invention will be described below in detail with reference to the accompanying drawings. However, the present invention is not limited to the description below and it is easily understood by those skilled in the art that the mode and details can be changed variously. Therefore, the present invention is not construed as being limited to description of the embodiments and example. In describing structures of the present invention with reference to the drawings, the same reference numerals are used in common for the same portions in different drawings. The same hatching pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

[Embodiment 1]

In this embodiment, modes of a semiconductor device and a method for manufacturing the semiconductor device will be described with reference to FIGS. 1A to 1C, FIGS. 2A to 2D, FIGS. 3A to 3E, FIGS. 4A to 4E, FIGS. 5A to 5E, FIGS. 6A to 6E, FIGS. 7A to 7E, and FIG. 15.

Figure 1B:
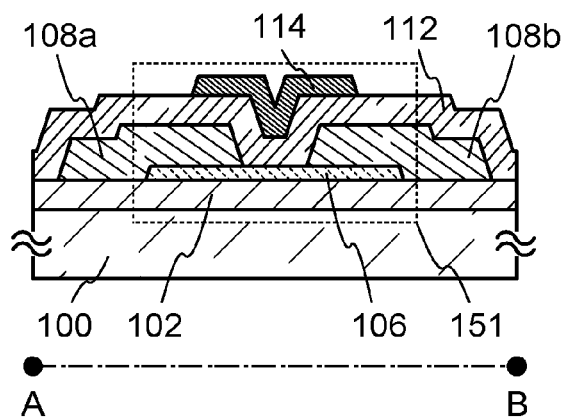
Figure 1C:
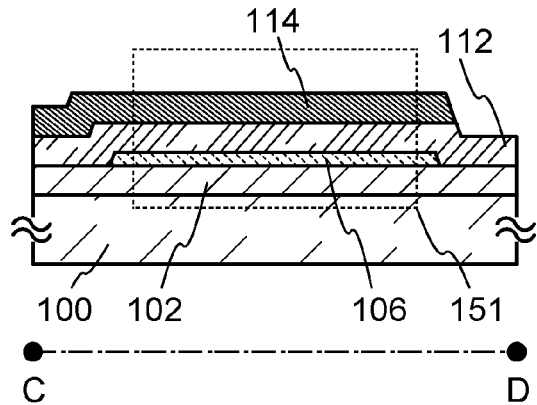

FIGS. 1A to 1C are a plan view and cross-sectional views, illustrating a transistor 151 which is a top-gate top-contact transistor as an example of a semiconductor device of an embodiment of the present invention. Here, FIG. 1A is a plan view, FIG. 1B is a cross-sectional view along A-B of FIG. 1A, and FIG. 1C is a cross-sectional view along C-D of FIG. 1A. Note that some components of the transistor 151 (e.g., a gate insulating layer 112) are omitted in FIG. 1A for brevity.

The transistor 151 illustrated in FIGS. 1A to 1C includes, over a substrate 100, a base insulating layer 102, an oxide semiconductor layer 106, a source electrode 108a, a drain electrode 108b, the gate insulating layer 112, and a gate electrode 114.

The oxynitride semiconductor layer 106 preferably contains at least indium (In) or zinc (Zn). In particular, In and Zn are preferably contained. As a stabilizer for reducing variation in electric characteristics of a transistor using the oxynitride, gallium (Ga) is preferably additionally contained. Tin (Sn) is preferably contained as a stabilizer. Hafnium (Hf) is preferably contained as a stabilizer. Zirconium (Zr) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, the oxynitride semiconductor can be formed by a sputtering method or the like in an atmosphere containing nitrogen using a target of any of the followings: indium oxide, tin oxide, zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also represented as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. Note that the oxynitride semiconductor can be formed by a vacuum evaporation method, a pulse laser deposition method, a CVD method, or the like without limitation to a sputtering method.

Note that, for example, an In—Ga—Zn-based oxide means an oxide containing In, Ga, and Zn, and there is no limitation on the ratio of In:Ga:Zn. The In—Ga—Zn-based oxide may contain a metal element besides the In, Ga, and Zn.

The atmosphere of deposition is preferably a mixed atmosphere of a rare gas (typically, argon) and nitrogen, a nitrogen atmosphere with 99% or more, or a mixed atmosphere of a rare gas, oxygen, and nitrogen.

The concentration of nitrogen contained in the oxynitride semiconductor layer 106 is greater than or equal to 0.1 atomic % and less than or equal to 30 atomic %, preferably greater than or equal to 5 atomic % and less than or equal to 20 atomic %. When the concentration of the nitrogen contained in the oxynitride semiconductor layer 106 is less than 0.1 atomic %, carrier density is insufficient, and when the concentration of the nitrogen contained in the oxynitride semiconductor layer 106 is greater than 30 atomic %, an insulating property is increased; consequently, in either case, a function as a semiconductor is lost.

Further, a protective insulating layer may be provided over the transistor 151. The protective insulating layer can have the same structure as the base insulating layer 102. In addition, in order that the source electrode 108a and the drain electrode 108b are electrically connected to a wiring, an opening may be formed in the gate insulating layer 112 and the like. A second gate electrode may further be provided below the oxynitride semiconductor layer 106. Note that the oxynitride semiconductor layer 106 is preferably processed into an island shape but is not necessarily processed into the shape.

FIGS. 2A to 2D and FIG. 15 illustrate cross-sectional structures of transistors having different structures from the transistor 151.

Figure 2A:
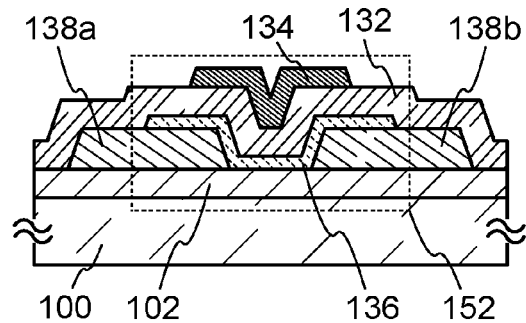
FIGS. 2A to 2D are cross-sectional views each illustrating one example of a semiconductor device that is one embodiment of the present invention.

A transistor 152 illustrated in FIG. 2A includes the base insulating layer 102, an oxynitride semiconductor layer 136, a source electrode 138a, a drain electrode 138b, a gate insulating layer 132, and a gate electrode 134. The differences between the transistor 152 and the transistor 151 are the positions where the oxynitride semiconductor layer is connected to the source electrode and the drain electrode. In other words, in the transistor 152, a lower part of the oxynitride semiconductor layer 136 is in contact with the source electrode 138a and the drain electrode 138b. The other components are similar to those of the transistor 151 in FIGS. 1A to 1C.

Figure 2B:
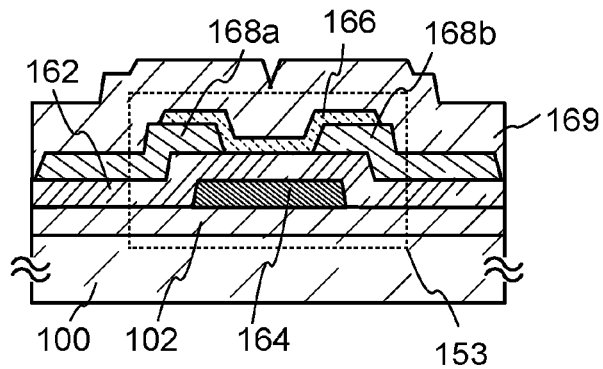

A transistor 153 illustrated in FIG. 2B includes the base insulating layer 102, an oxynitride semiconductor layer 166, a source electrode 168a, a drain electrode 168b, a gate insulating layer 162, and a gate electrode 164. The difference between the transistor 153 and the transistor 151 is the position of the gate electrode with respect to the oxynitride semiconductor layer. In other words, in the transistor 153, the gate electrode 164 is provided below the oxynitride semiconductor layer 166 with the gate insulating layer 162 provided therebetween. In addition, in the transistor 153, a protective insulating layer 169 is provided to cover the source electrode 168a, the drain electrode 168b, and the oxynitride semiconductor layer 166. The other components are similar to those of the transistor 152 in FIG. 2A.

Figure 2C:
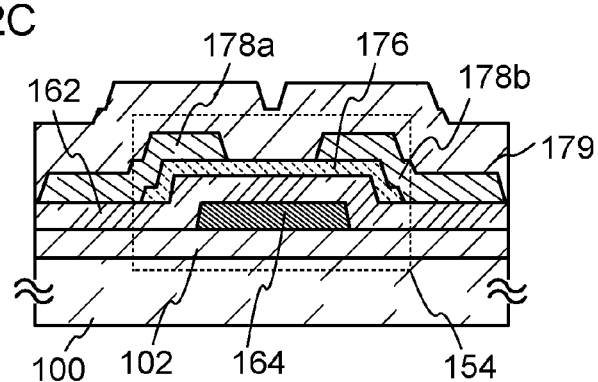

A transistor 154 illustrated in FIG. 2C includes the base insulating layer 102, an oxynitride semiconductor layer 176, a source electrode 178a, a drain electrode 178b, the gate insulating layer 162, and the gate electrode 164. The difference between the transistor 154 and the transistor 151 is the position of the gate electrode with respect to the oxynitride semiconductor layer. In other words, in the transistor 154, the gate electrode 164 is provided below the oxynitride semiconductor layer 176 with the gate insulating layer 162 provided therebetween. In addition, in the transistor 154, a protective insulating layer 179 is provided to cover the source electrode 178a, the drain electrode 178b, and the oxynitride semiconductor layer 176. The other components are similar to those of the transistor 151 in FIGS. 1A to 1C.

Figure 2D:
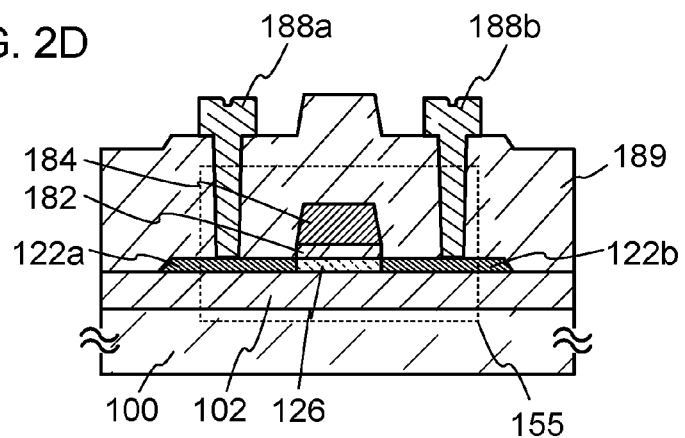

A transistor 155 illustrated in FIG. 2D includes the base insulating layer 102, a gate insulating layer 182, a gate electrode 184, a source electrode 188a, and a drain electrode 188b. The transistor 155 is different from the transistor 151 and the transistor 152 in that a channel region 126, a source region 122a, and a drain region 122b are formed over one flat surface in the oxynitride semiconductor layer. The source electrode 188a and the drain electrode 188b are connected to the source region 122a and the drain region 122b respectively, through a protective insulating layer 189. Note that the channel region 126 is a region overlapping with the gate electrode 184 and may be formed using the same material as that of the source region 122a and the drain region 122b.

The base insulating layer 102 can have the same structure as the base insulating layer 102 of the transistor 151. After the oxynitride semiconductor layer is formed, the gate insulating layer 182 and the gate electrode 184 are formed. The gate electrode 184 and the gate insulating layer 182 can be processed using the same mask. Alternatively, after the gate electrode 184 is processed, the gate insulating layer 182 may be processed using the gate electrode 184 as a mask. Next, the resistance of the oxynitride semiconductor layer is reduced using the gate electrode 184 as a mask, whereby the source region 122a and the drain region 122b are formed. A region below the gate electrode 184 is the channel region 126. Note that even in the case where the reduction of the resistance is not performed, the transistor 155 can be formed by appropriately adjusting the resistance value of the oxynitride semiconductor layer, without formation of the source region 122a and the drain region 122b.

Figure 15:
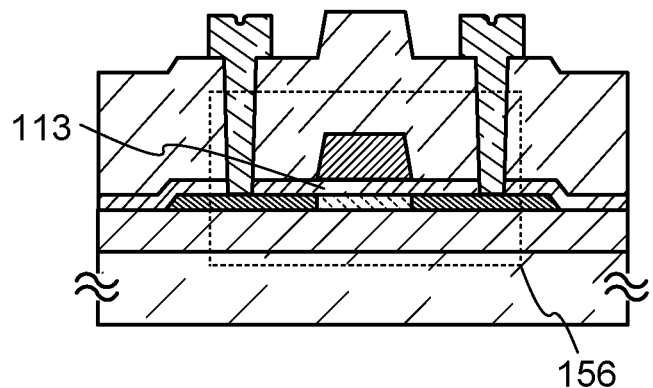
FIG. 15 is a cross-sectional view illustrating one example of a semiconductor device that is one embodiment of the present invention.

In a transistor 156 illustrated in FIG. 15, the resistance of the oxynitride semiconductor layer can be reduced by adding a dopant to the oxynitride semiconductor layer by, for example, an ion implantation method without removing a gate insulating layer 113, while in the transistor 155 illustrated in FIG. 2D, part of the insulating layer which is to be the gate insulating layer 182 is removed and part of the oxynitride semiconductor layer is exposed when the resistance of the source region 122a and the drain region 122b is reduced.

Next, an example of a process for manufacturing the transistor 151 illustrated in FIGS. 1A to 1C is described with reference to FIGS. 3A to 3E.

Figure 3A:
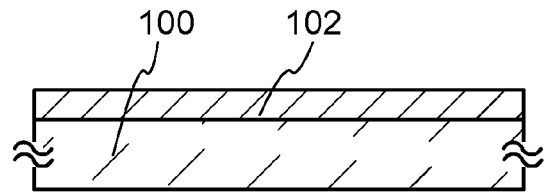
FIGS. 3A to 3E are cross-sectional views illustrating one example of a manufacturing process of a semiconductor device that is one embodiment of the present invention.

First, the base insulating layer 102 is formed over the substrate 100 (see FIG. 3A).

Although there is no particular limitation on a material and the like of the substrate 100, it is necessary that the substrate have heat resistance high enough to withstand at least heat treatment performed later. For example, a glass substrate, a ceramic substrate, a quartz substrate, or a sapphire substrate can be used as the substrate 100. Alternatively, a single crystal semiconductor substrate or a polycrystalline semiconductor substrate made of silicon, silicon carbide, or the like, a compound semiconductor substrate made of GaAs, silicon germanium, or the like, an SOI substrate, or the like may be used as the substrate 100. Still alternatively, any of these substrates further provided with a semiconductor element may be used as the substrate 100.

A flexible substrate may alternatively be used as the substrate 100. When a transistor is provided over the flexible substrate, the transistor may be formed directly on the flexible substrate, or the transistor may be formed over a different substrate and then separated to be transferred to the flexible substrate. In order to separate the transistor to transfer it to the flexible substrate, a separation layer is preferably formed between the different substrate and the transistor.

As a material of the base insulating layer 102, silicon oxide, silicon oxynitride, or the like may be used. Alternatively, the base insulating layer 102 may be formed using stacked layers of the above material and a material such as silicon oxide, silicon nitride, silicon oxynitride, silicon nitride oxide, aluminum oxide, aluminum nitride, aluminum oxynitride, gallium oxide, hafnium oxide, yttrium oxide, a mixed material of any of them, or the like. For example, when the base insulating layer 102 has a stacked structure of a silicon nitride layer and a silicon oxide layer, entry of moisture from the substrate or the like to the transistor 151 can be prevented. In the case where the base insulating layer 102 is formed to have a stacked structure, a silicon oxide layer, a silicon oxynitride layer, or the like is preferably formed as a layer in contact with the oxynitride semiconductor layer 106. Note that the base insulating layer 102 functions as a base layer of the transistor 151.

As the base insulating layer 102, an oxide insulating layer containing oxygen whose amount exceeds the amount of oxygen satisfying the stoichiometric proportion is preferably used.

In the oxide insulating layer containing oxygen whose amount exceeds the amount of oxygen satisfying the stoichiometric proportion, the released amount of oxygen which is converted to oxygen atoms is greater than or equal to $1.0 \times 10^{18}$ atoms/cm$^3$, preferably greater than or equal to $1.0 \times 10^{20}$ atoms/cm$^3$, more preferably greater than or equal to $3.0 \times 10^{20}$ atoms/cm$^3$ in thermal desorption spectroscopy (TDS).

Here, in TDS analysis, the measurement method of the amount of released oxygen when converted into oxygen atoms is described below.

The released amount of gas in the TDS analysis is proportional to an integral value of spectrum. Thus, from the ratio of the integral value of spectrum of the oxide insulating layer to a reference value of a standard sample, the released amount of gas can be calculated. The reference value of the standard sample is a ratio of molecular density to an integral value of spectrum of a sample containing given molecules.

For example, from a TDS analysis result of a silicon wafer containing hydrogen at a given density, which is a standard sample, and a TDS analysis result of an oxide insulating layer, the amount of oxygen molecules ($N_{(O2)}$) released from the oxide insulating layer can be obtained by Equation 1. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{(O2)} = N_{(H2)} / S_{(H2)} \times S_{(O2)} \times \alpha \quad \text{(Equation 1)}$$

$N_{(H2)}$ is the value obtained by conversion of the number of hydrogen molecules released from the standard sample into densities. $S_{(H2)}$ is an integral value of spectrum of a standard sample which is analyzed by TDS. Here, the reference value of the standard sample is set to $N_{(H2)}/S_{(H2)}$. $S_{(O2)}$ is an integral value of spectrum when the oxide insulating film is analyzed by TDS. $\alpha$ is a coefficient which influences spectrum intensity in TDS analysis. The detail of Numerical Equation 1 is referred to Japanese Published Patent Application No. H6-275697. Note that the amount of released oxygen from the above oxide insulating layer is measured with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

Further, in the TDS analysis, some amount of oxygen is detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules Note that $N_{(O2)}$ is the number of the released oxygen molecules. For the oxide insulating layer, the amount of released oxygen when converted into oxygen atoms is twice the number of the released oxygen molecules.

When the oxide insulating layer containing oxygen whose amount exceeds the amount of oxygen satisfying the stoichiometric proportion is formed by a sputtering method, the amount of oxygen contained in a deposition gas is preferably large, and oxygen, a mixed gas of oxygen and a rare gas, or the like can be used. Typically, the oxygen concentration of a deposition gas is preferably greater than or equal to 6% and less than or equal to 100%.

A silicon oxide film can be formed as a typical example of an oxide insulating layer containing oxygen whose amount exceeds the amount of oxygen satisfying the stoichiometric proportion. In that case, the silicon oxide film is preferably formed by a RF sputtering method under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa), the high-frequency power is greater than or equal to 0.5 kW and less than or equal to 12 kW (preferably greater than or equal to 1 kW and less than or equal to 5 kW); and the proportion of oxygen ($O_2/(O_2+Ar)$) in the deposition gas is greater than or equal to 1% and less than or equal to 100% (preferably greater than or equal to 6% and less than or equal to 100%). Note that a silicon target may be used as the target instead of the quartz (preferably synthetic quartz) target. In addition, oxygen alone may be used as the deposition gas.

Figure 3B:
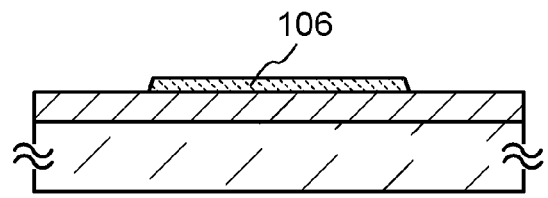

Next, an oxynitride semiconductor layer is formed over the base insulating layer 102 and then is processed to form the oxynitride semiconductor layer 106 having an island shape (see FIG. 3B).

The oxynitride semiconductor layer 106 can be formed using a sputtering method or the like with the use of nitrogen as a deposition gas. The oxynitride semiconductor layer 106 preferably has a thickness greater than or equal to 3 nm and less than or equal to 50 nm. If the oxynitride semiconductor layer 106 is too thick (e.g., a thickness of 100 nm or more), the influence of a short-channel effect is increased, and there is a possibility that a transistor with a small channel length is normally-on. Here, the "normally-on" refers to a state in which a channel exists even when voltage is not applied to the gate electrode and current flows in the transistor. Note that the base insulating layer 102 and the oxynitride semiconductor layer 106 are preferably deposited successively without exposure to the air.

Alternatively, the oxynitride semiconductor layer 106 may be formed in such a manner that an oxide semiconductor layer is deposited using the above-described oxide target and then nitrogen is introduced into the oxide semiconductor layer.

Nitrogen can be introduced into the oxide semiconductor layer by an ion doping method or an ion implantation method. Alternatively, nitrogen can be introduced into the oxide semiconductor layer in such a manner that the oxide semiconductor layer is exposed to plasma generated by nitrogen or a gas containing nitrogen.

In this embodiment, the oxynitride semiconductor layer 106 is formed by sputtering in a mixed atmosphere of argon and nitrogen with the use of an In—Ga—Zn—O-based oxide target.

During deposition by a sputtering method, the temperature of the surface where a film is deposited is preferably higher than or equal to 100° C. and lower than or equal to the upper limit of heat treatment of the substrate. Consequently, an impurity such as water or hydrogen can be prevented from entering an object to be deposited.

Moreover, when the leakage rate of a treatment chamber of a sputtering apparatus is set to lower than or equal to $1 \times 10^{-10}$ Pa·m³/sec., entry of impurities such as an alkali metal or a hydride into the crystalline oxide semiconductor film that is being formed by a sputtering method can be reduced. Further, with use of an entrapment vacuum pump as an evacuation system, counter flow of impurities such as an alkali metal, a hydrogen atom, a hydrogen molecule, water, a hydroxyl group, or a hydride from the evacuation system can be reduced As the In—Ga—Zn—O-based oxide target, for example, an oxide target having a composition ratio of $In_2O_3:Ga_2O_3:ZnO=1:1:1$ [molar ratio] can be used. Note that it is not necessary to limit the material and the composition ratio of the target to the above. For example, an oxide target having a composition ratio of $In_2O_3:Ga_2O_3:ZnO=1:1:2$ [molar ratio] can be used alternatively.

The relative density of the oxide target is greater than or equal to 90% and less than or equal to 100%, preferably, greater than or equal to 95% and less than or equal to 99.9%. By using the metal oxide target with high relative density, the oxynitride semiconductor layer 106 can be a dense layer.

The deposition may be performed in a rare gas atmosphere, an oxygen atmosphere, a mixed gas atmosphere of a rare gas and oxygen, or the like. Moreover, it is preferable to use an atmosphere using a high-purity gas from which impurities such as hydrogen, water, a hydroxyl group, and hydride are sufficiently removed in order to prevent entry of hydrogen, water, a hydroxyl group, and hydride into the oxide semiconductor layer.

The process for forming the oxynitride semiconductor layer 106 can be performed in such a manner that a mask having a desired shape is formed over the oxynitride semiconductor layer and then the oxynitride semiconductor layer is etched. The above-described mask can be formed by a method such as photolithography. Alternatively, a method such as an inkjet method may be used to form the mask.

Note that the etching of the oxynitride semiconductor layer may be dry etching or wet etching. Needless to say, these may be combined.

Figure 3C:
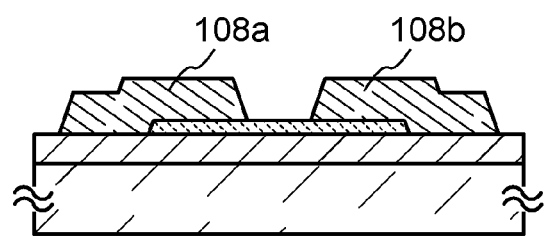

Next, a conductive layer for forming the source electrode and the drain electrode (including a wiring formed in the same layer as the source electrode and the drain electrode) is formed over the base insulating layer 102 and the oxynitride semiconductor layer 106, and the conductive layer is processed to form the source electrode 108a and the drain electrode 108b (see FIG. 3C). Note that a channel length L of the transistor is determined by the distance between edges of the source electrode 108a and the drain electrode 108b which are formed here.

As the conductive layer used for the source electrode 108a and the drain electrode 108b, for example, a metal layer containing an element selected from Al, Cr, Cu, Ta, Ti, Mo, and W; a metal nitride layer containing any of the above elements as its component; or the like can be used. Another structure may be used, in which a high-melting-point metal layer of Ti, Mo, W, or the like or a metal nitride layer of any of these elements is stacked on one of or both a bottom side and a top side of a metal layer of Al, Cu, or the like.

Further, the conductive layer used for the source electrode 108a and the drain electrode 108b may be formed using conductive metal oxide. As conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials in which silicon or silicon oxide is contained can be used.

The conductive layer can be processed by etching with the use of a resist mask. Ultraviolet, a KrF laser light, an ArF laser light, or the like is preferably used for light exposure for forming a resist mask for the etching.

In order that the channel length L is less than 25 nm, the light exposure is preferably performed at the time of forming the resist mask using, for example, extreme ultraviolet having an extremely short wavelength of several nanometers to several tens of nanometers. In the light exposure by extreme ultraviolet light, the resolution is high and the focus depth is large. Thus, the channel length L of the transistor formed later can be reduced, whereby the operation speed of a circuit can be increased.

The etching may be performed with the use of a resist mask formed using a so-called multi-tone mask. A resist mask formed using a multi-tone mask has a plurality of thicknesses and can be further changed in shape by ashing; thus, such a resist mask can be used in a plurality of etching steps for different patterns. Therefore, a resist mask corresponding to at least two kinds of different patterns can be formed by using one multi-tone mask. In other words, simplification of the steps can be realized.

Note that in the etching of the conductive layer, part of the oxynitride semiconductor layer 106 is etched, so that the oxynitride semiconductor layer having a groove (a recessed portion) is formed in some cases.

After that, plasma treatment may be performed using a gas such as oxygen, ozone, nitrogen dioxide so that an exposed surface of the oxynitride semiconductor layer 106 is oxidized and oxygen deficiency is compensated. In the case where the plasma treatment is performed, the gate insulating layer 112 in contact with part of the oxynitride semiconductor layer 106 is preferably formed following the plasma treatment without exposure to the air.

Figure 3D:
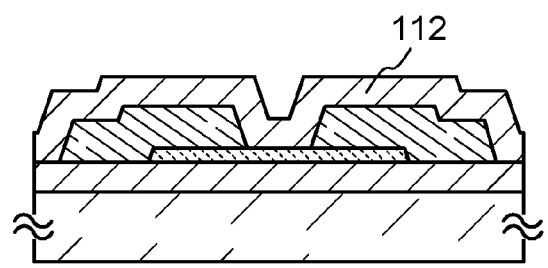

Then, the gate insulating layer 112 is formed to cover the source electrode 108a and the drain electrode 108b and be in contact with part of the oxynitride semiconductor layer 106 (see FIG. 3D).

The gate insulating layer 112 can have the same structure as the base insulating layer 102. Note that a material having a high dielectric constant, such as hafnium oxide or aluminum oxide, may be used for the gate insulating layer 112 considering the function of the gate insulating layer of the transistor. Alternatively, a material having a high dielectric constant, such as hafnium oxide or aluminum oxide, may be stacked on silicon oxide, silicon oxynitride, or silicon nitride, considering the gate withstand voltage and the interface state with the oxynitride semiconductor. The total thickness of the gate insulating layer 112 is preferably greater than or equal to 1 nm and less than or equal to 300 nm, further preferably greater than or equal to 5 nm and less than or equal to 50 nm. As the thickness of the gate insulating layer is larger, a short channel effect is enhanced more and the threshold voltage tends to shift more in the negative side. On the other hand, it is known that leakage due to tunnel current is increased when the thickness of the gate insulating layer is less than or equal to 5 nm.

Figure 3E:
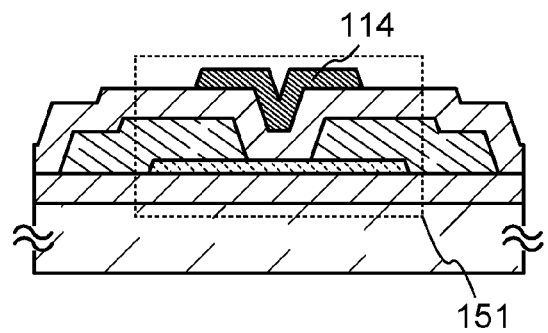

Then, the gate electrode 114 is formed over the oxynitride semiconductor layer 106 with the gate insulating layer 112 provided therebetween (see FIG. 3E). The gate electrode 114 can be formed using a metal material such as molybdenum, titanium, tantalum, tungsten, aluminum, copper, neodymium, or scandium; a nitride of any of these materials; or an alloy material containing any of these materials as a main component. Note that the gate electrode 114 may be formed with a single-layer structure or a stacked structure.

Through the above-described process, the transistor 151 is manufactured.

Next, an example of a manufacturing process of the transistor 152 illustrated in FIG. 2A is described with reference to FIGS. 4A to 4E.

Figure 4A:
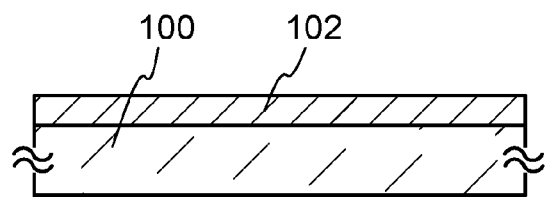
FIGS. 4A to 4E are cross-sectional views illustrating one example of a manufacturing process of a semiconductor device that is one embodiment of the present invention.

First, the base insulating layer 102 is formed over the substrate 100 (see FIG. 4A).

Figure 4B:
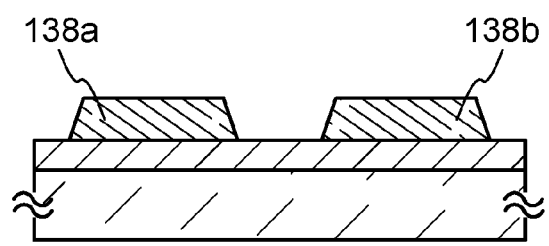

Next, a conductive layer for forming a source electrode and a drain electrode (including a wiring formed in the same layer as the source electrode and the drain electrode) is formed over the base insulating layer 102, and the conductive layer is processed to form the source electrode 138a and the drain electrode 138b (see FIG. 4B).

Figure 4C:
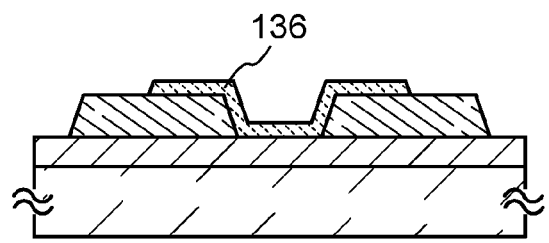

Then, an oxynitride semiconductor layer is formed over the base insulating layer 102, the source electrode 138a, and the drain electrode 138b, and the oxynitride semiconductor layer is processed to form the oxynitride semiconductor layer 136 having an island shape (see FIG. 4C).

Figure 4D:
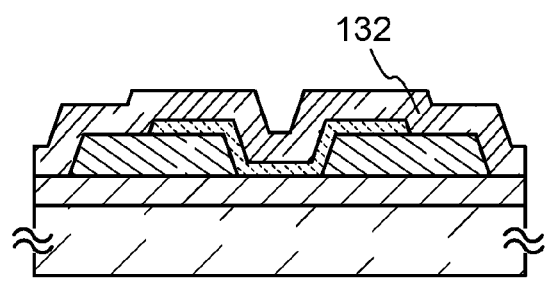

Next, the gate insulating layer 132 is formed to cover the source electrode 138a and the drain electrode 138b and be in contact with part of the oxynitride semiconductor layer 136 (see FIG. 4D).

Figure 4E:
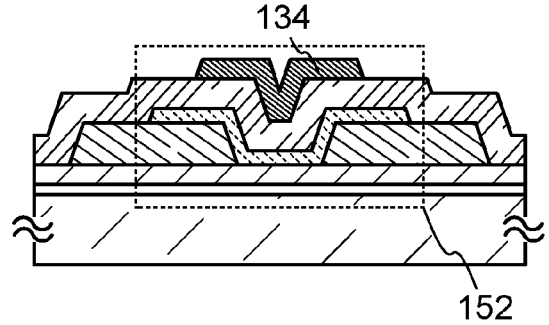

Then, the gate electrode 134 is formed over the oxynitride semiconductor layer 136 with the gate insulating layer 132 provided therebetween (see FIG. 4E).

Through the above-described process, the transistor 152 is formed.

Next, an example of a manufacturing process of the transistor 153 illustrated in FIG. 2B is described with reference to FIGS. 5A to 5E.

Figure 5A:
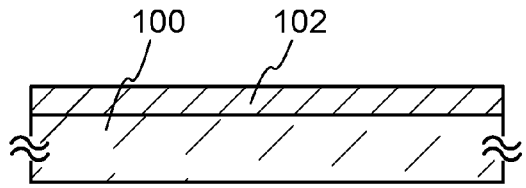
FIGS. 5A to 5E are cross-sectional views illustrating one example of a manufacturing process of a semiconductor device that is one embodiment of the present invention.

First, the base insulating layer 102 is formed over the substrate 100 (see FIG. 5A).

Figure 5B:
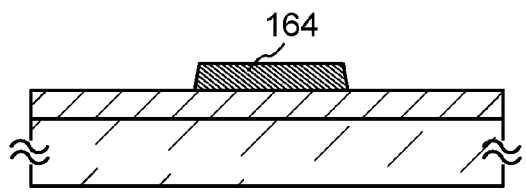

Next, the gate electrode 164 is formed over the base insulating layer 102 (see FIG. 5B).

Figure 5C:
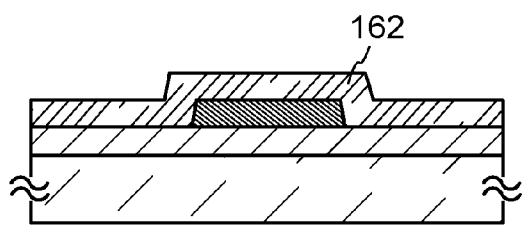
Figure 5D:
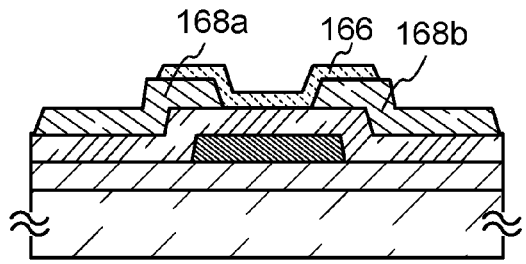

Then, the gate insulating layer 162 covering the gate electrode 164 is formed (see FIG. 5C).

Next, the source electrode 168a and the drain electrode 168b are formed over the gate insulating layer 162. An oxynitride semiconductor layer is formed over the source electrode 168a and the drain electrode 168b, and the oxynitride semiconductor layer is processed to form the oxynitride semiconductor layer 166 having an island shape (see FIG. 5D).

Figure 5E:
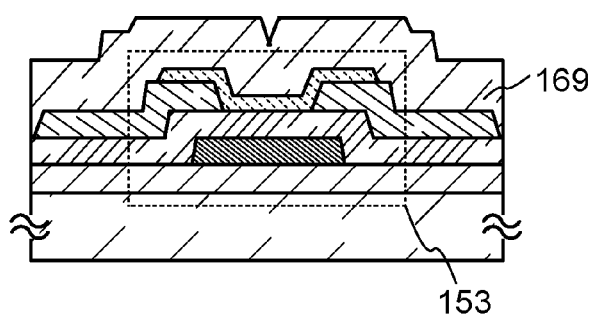

Next, the protective insulating layer 169 is formed to cover the oxynitride semiconductor layer 166, the source electrode 168a, and the drain electrode 168b (see FIG. 5E).

Note that the protective insulating layer 169 can have the same structure as the gate insulating layer 162.

Through the above-described process, the transistor 153 is formed.

Next, an example of a manufacturing process of the transistor 154 illustrated in FIG. 2C is described with reference to FIGS. 6A to 6E.

Figure 6A:
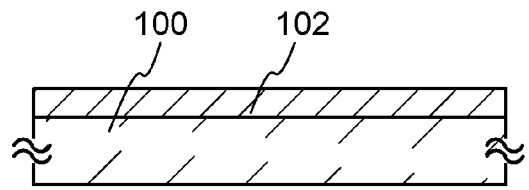
FIGS. 6A to 6E are cross-sectional views illustrating one example of a manufacturing process of a semiconductor device that is one embodiment of the present invention.

First, the base insulating layer 102 is formed over the substrate 100 (see FIG. 6A).

Figure 6B:
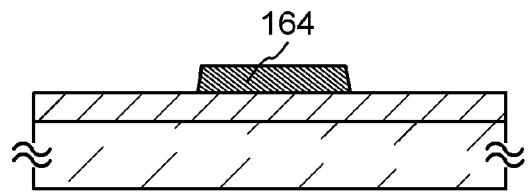

Next, the gate electrode 164 is formed over the base insulating layer 102 (see FIG. 6B).

Figure 6C:
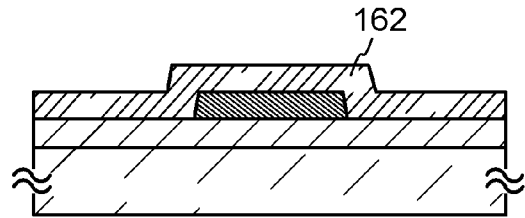
Figure 6D:
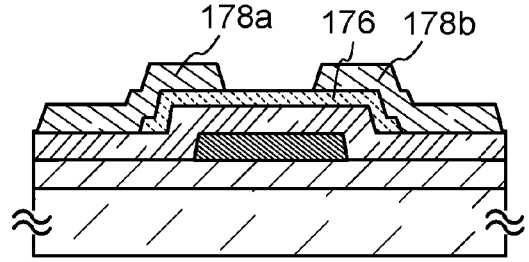

Then, the gate insulating layer 162 covering the gate electrode 164 is formed (see FIG. 6C).

Next, an oxynitride semiconductor layer is formed over the gate insulating layer 162 and the oxynitride semiconductor layer is processed to form the oxynitride semiconductor layer 176 having an island shape. Then, the source electrode 178a and the drain electrode 178b are formed in contact with the oxynitride semiconductor layer 176 (see FIG. 6D).

Figure 6E:
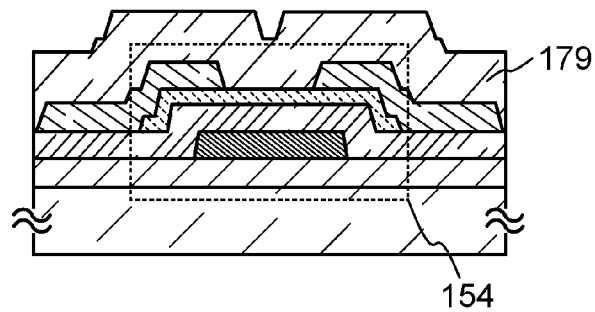

Next, the protective insulating layer 179 is formed to cover the oxynitride semiconductor layer 176, the source electrode 178a, and the drain electrode 178b (see FIG. 6E).

Through the above-described process, the transistor 154 is formed.

An example of a manufacturing process of the transistor 155 illustrated in FIG. 2D is described with reference to FIGS. 7A to 7E.

Figure 7A:
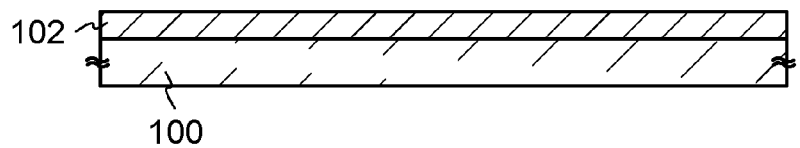
FIGS. 7A to 7E are cross-sectional views illustrating one example of a manufacturing process of a semiconductor device that is one embodiment of the present invention.

First, the base insulating layer 102 is formed over the substrate 100 (see FIG. 7A).

Figure 7B:
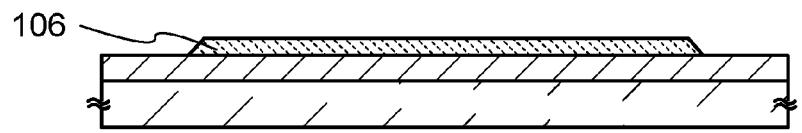

Next, an oxynitride semiconductor layer is formed over the base insulating layer 102 and the oxynitride semiconductor layer is processed to form the oxynitride semiconductor layer 106 having an island shape (see FIG. 7B).

Figure 7C:
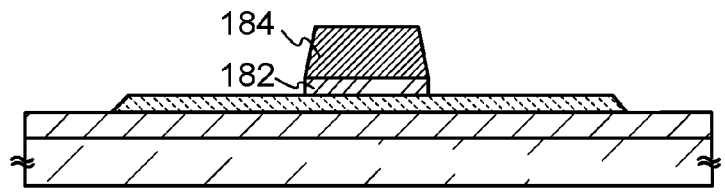
Figure 7D:
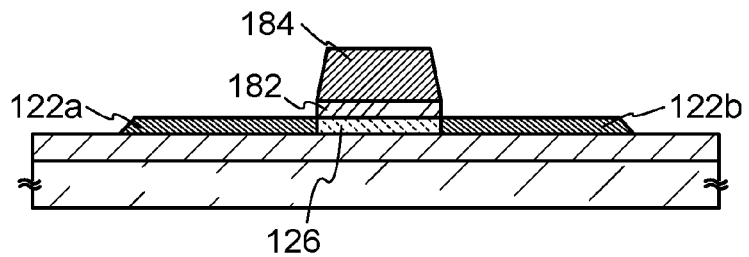
Figure 7E:
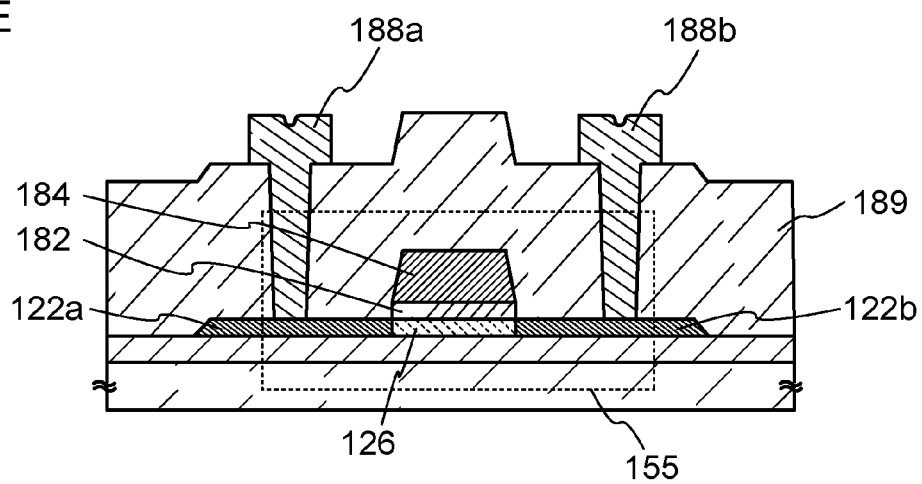

Next, the gate insulating layer 182 and the gate electrode 184 are formed and processed to have the same pattern by photolithography (see FIG. 7C). In this step, the gate electrode 184 may be processed and then the gate insulating layer 182 may be processed using the gate electrode 184 as a mask.

Next, the resistance of the oxynitride semiconductor layer 106 is reduced using the gate electrode 184 as a mask, so that the source region 122a and the drain region 122b are formed. A region below the gate electrode, whose resistance is not reduced, serves as the channel region 126 (see FIG. 7D). In that case, a channel length L of the transistor is determined by the width of the gate electrode. In this manner, by performing patterning using the gate electrode as a mask, an overlap of the gate electrode with the source or drain region is not formed and a parasitic capacitance is not generated in this region, so that the operation speed of the transistor can be increased.

As a method for reducing the resistance, plasma treatment using a rare gas such as argon, hydrogen plasma treatment, ammonia plasma treatment, and the like can be given. In addition, plasma treatment in an atmosphere containing phosphorus (P) or boron (B) may be combined with any of such treatment.

Next, the protective insulating layer 189 is formed and openings are formed in regions of the protective insulating layer 189 overlapping with the source region and the drain region. A conductive layer for forming the source electrode and the drain electrode (including a wiring formed in the same layer as the source electrode and the drain electrode) is formed and the conductive layer is processed to form the source electrode 188a and the drain electrode 188b (see FIG. 7E).

Through the above-described process, the transistor 155 is formed.

As described above, when an oxynitride semiconductor is used for a channel, a transistor whose carrier densities in a channel region, a source region, and a drain region are controlled and whose performance is higher than or equal to that of a transistor using an oxide semiconductor can be manufactured even without heat treatment.

Further, by forming the active layer using an oxynitride semiconductor, even without additionally forming a low resistance layer, a favorable contact with the source electrode and the drain electrode can be exhibited, and on current can be increased.

The structures, methods, and the like described in this embodiment can be combined as appropriate with any of the structures, methods, and the like and described in the other embodiments.

[Embodiment 2]

A semiconductor device having a display function (also referred to as a display device) can be manufactured with the use of the transistor exemplified in Embodiment 1. Moreover, part or all of driver circuitry which includes the transistor can be formed over a substrate where a pixel portion is formed, whereby a system-on-panel can be obtained.

Figure 8A:
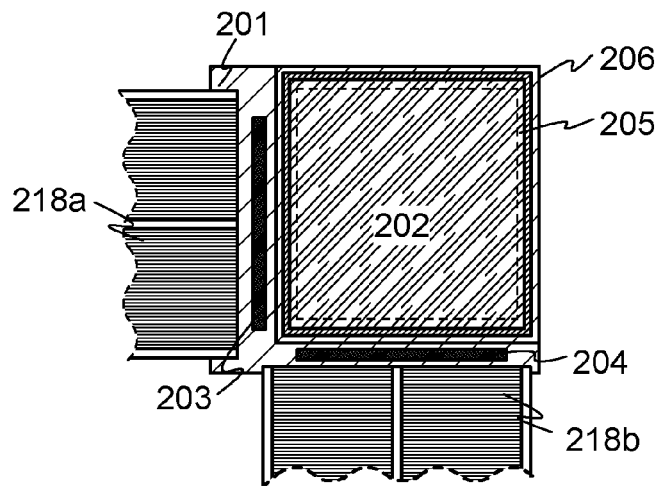
FIGS. 8A to 8C each illustrate one mode of a semiconductor device that is one embodiment of the present invention.

In FIG. 8A, a sealant 205 is provided so as to surround a pixel portion 202 provided over a first substrate 201, and the pixel portion 202 is sealed between the first substrate 201 and a second substrate 206. In FIG. 8A, a scan line driver circuit 204 and a signal line driver circuit 203 which are formed using a single crystal semiconductor layer or a polycrystalline semiconductor layer over a substrate separately prepared are mounted in a region that is different from the region surrounded by the sealant 205 over the first substrate 201. Further, various signals and potentials are supplied to the signal line driver circuit 203 and the scan line driver circuit 204 which are separately formed and to the pixel portion 202 from flexible printed circuits (FPCs) 218a and 218b.

Figure 8B:
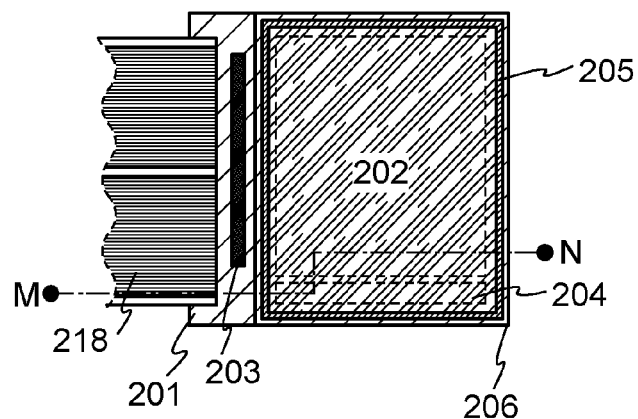
Figure 8C:
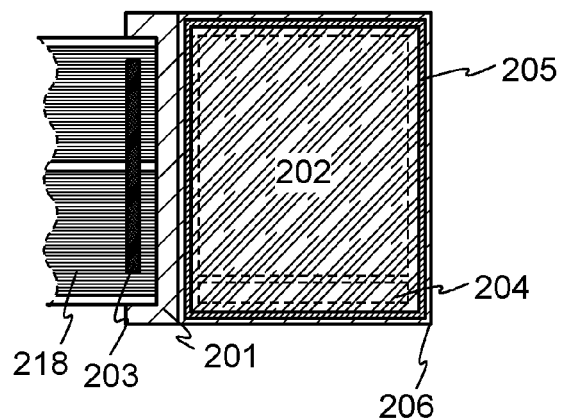

In FIGS. 8B and 8C, the sealant 205 is provided so as to surround the pixel portion 202 and the scan line driver circuit 204 which are provided over the first substrate 201. The second substrate 206 is provided over the pixel portion 202 and the scan line driver circuit 204. Consequently, the pixel portion 202 and the scan line driver circuit 204 are sealed together with a display element, by the first substrate 201, the sealant 205, and the second substrate 206. In FIGS. 8B and 8C, the signal line driver circuit 203, which is formed using a single crystal semiconductor layer or a polycrystalline semiconductor layer over a substrate prepared separately, is mounted in a region that is different from the region surrounded by the sealant 205 over the first substrate 201. In FIGS. 8B and 8C, various signals and potentials are supplied to the signal line driver circuit 203 which is separately formed, the scan line driver circuit 204, and the pixel portion 202 from a FPC 218.

Although FIGS. 8B and 8C each illustrate the example in which the signal line driver circuit 203 is formed separately and mounted on the first substrate 201, the present invention is not limited to this structure. The scan line driver circuit may be formed separately and then mounted, or only part of the signal line driver circuit or part of the scan line driver circuit may be formed separately and then mounted.

Note that a connection method of a separately formed driver circuit is not particularly limited, and a chip on glass (COG) method, a wire bonding method, a tape automated bonding (TAB) method or the like can be used. FIG. 8A illustrates an example in which the signal line driver circuit 203 and the scan line driver circuit 204 are mounted by a COG method. FIG. 8B illustrates an example in which the signal line driver circuit 203 is mounted by a COG method. FIG. 8C illustrates an example in which the signal line driver circuit 203 is mounted by a TAB method.

In addition, the display device includes a panel in which a display element is sealed, and a module in which an IC and the like including a controller are mounted on the panel.

Note that a display device in this specification means an image display device, a display device, or a light source (including a lighting device). The display device includes any of the following modules: a module provided with a connector such as an FPC, a TAB tape, or TCP; a module in which a printed wiring board is provided in the end of a TAB tape or TCP; and a module in which an integrated circuit (IC) is mounted directly on a display element by a COG method.

The pixel portion and the scan line driver circuit provided over the first substrate include a plurality of transistors and any of the transistors which are described in Embodiment 1 can be applied.

As the display element provided in the display device, a liquid crystal element (also referred to as a liquid crystal display element) or a light-emitting element (also referred to as a light-emitting display element) can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used.

Figure 9:
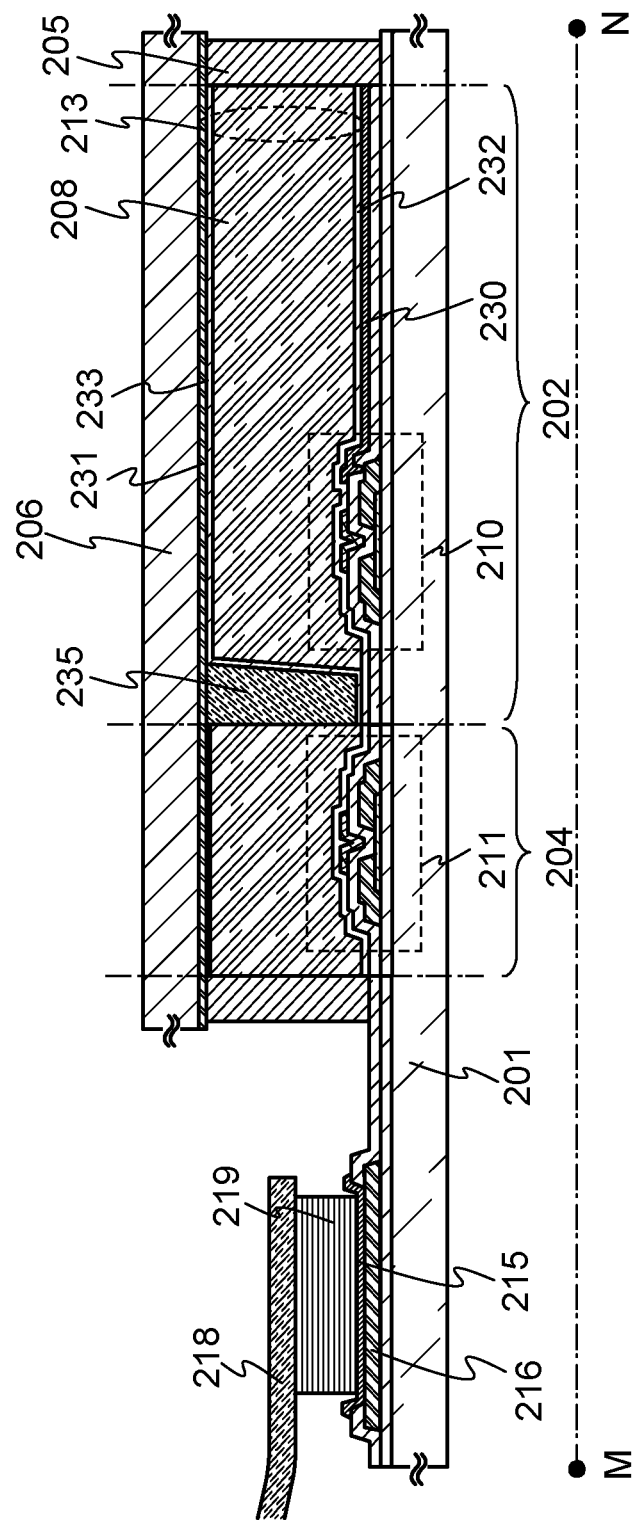
FIG. 9 illustrates one mode of a semiconductor device that is one embodiment of the present invention.
Figure 10:
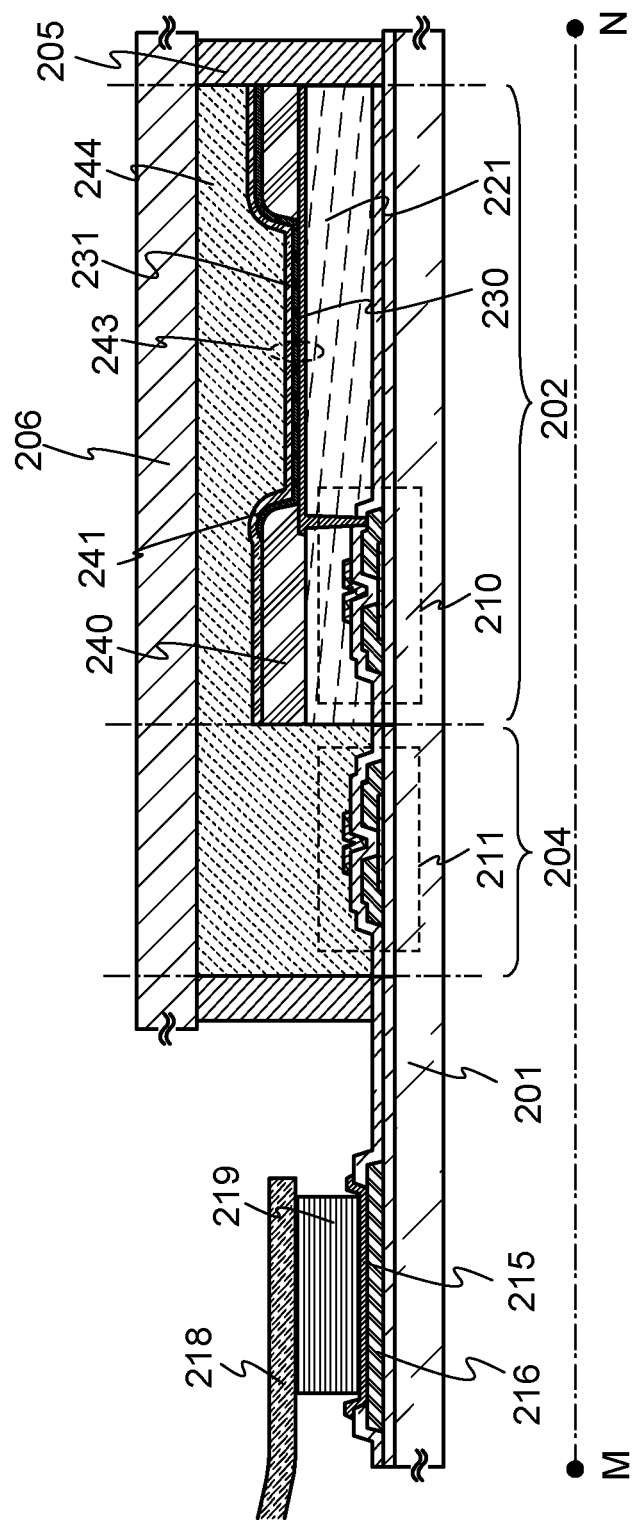
FIG. 10 illustrates one mode of a semiconductor device that is one embodiment of the present invention.
Figure 11:
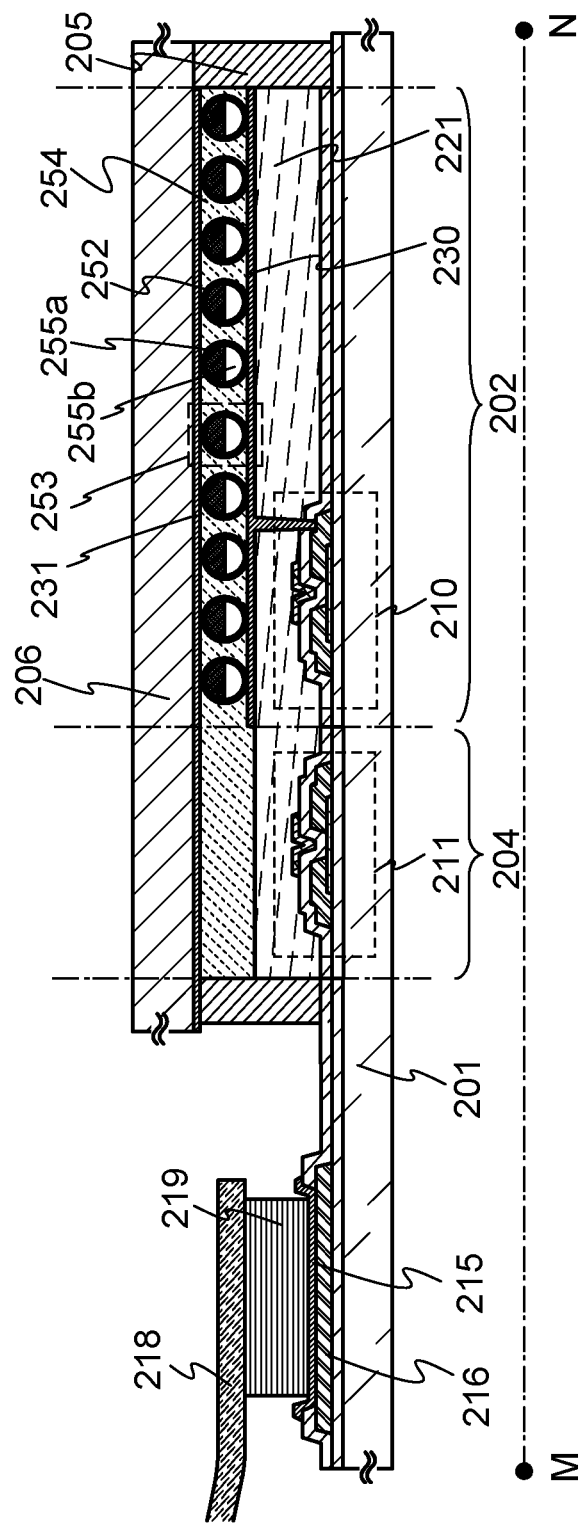
FIG. 11 illustrates one mode of a semiconductor device that is one embodiment of the present invention.

An embodiment of the semiconductor device is described with reference to FIG. 9, FIG. 10, and FIG. 11. FIG. 9, FIG. 10, and FIG. 11 correspond to cross-sectional views along line M-N in FIG. 8B.

As illustrated in FIG. 9 to FIG. 11, the semiconductor device includes a connection terminal electrode 215 and a terminal electrode 216. The connection terminal electrode 215 and the terminal electrode 216 are electrically connected to a terminal included in the FPC 218 through an anisotropic conductive layer 219.

The connection terminal electrode 215 is formed using the same conductive layer as a first electrode 230, and the terminal electrode 216 is formed using the same conductive layer as source and drain electrodes of a transistor 210 and a transistor 211.

The pixel portion 202 and the scan line driver circuit 204 provided over the first substrate 201 each include a plurality of transistors. FIG. 9, FIG. 10, and FIG. 11 each illustrate the transistor 210 included in the pixel portion 202 and the transistor 211 included in the scan line driver circuit 204.

In this embodiment, the transistor described in Embodiment 1 can be applied to the transistor 210 and the transistor 211. The transistor 210 and the transistor 211 can have sufficient on characteristics even without heat treatment at a high temperature or the like. Therefore, as the semiconductor devices illustrated in FIG. 9 to FIG. 11, semiconductor devices can be provided with low cost.

The transistor 210 provided in the pixel portion 202 is electrically connected to the display element to form a display panel. There is no particular limitation on the kind of the display element as long as display can be performed, and various kinds of display elements can be employed.

Note that an example of a liquid crystal display device using a liquid crystal element as a display element is described in FIG. 9. In FIG. 9, a liquid crystal element 213 which is a display element includes the first electrode 230, a second electrode 231, and a liquid crystal layer 208. Note that insulating layers 232 and 233 functioning as alignment layers are provided so that the liquid crystal layer 208 is provided therebetween. The second electrode 231 is provided on the second substrate 206 side, and the first electrode 230 and the second electrode 231 are stacked with the liquid crystal layer 208 provided therebetween.

A spacer 235 is a columnar spacer obtained by selective etching of an insulating layer and is provided in order to control the thickness (a cell gap) of the liquid crystal layer 208. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, a liquid crystal exhibiting a blue phase for which an alignment layer is unnecessary may be used for the liquid crystal layer 208. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed is used for the liquid crystal layer in order to improve the temperature range. The liquid crystal composition which includes a liquid crystal exhibiting a blue phase and a chiral agent has a short response time of 1 msec or less, has optical isotropy, which makes the alignment process unneeded, and has a small viewing angle dependence. In addition, since an alignment layer does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is greater than or equal to $1\times10^9$ Ω·cm, preferably greater than or equal to $1\times10^{11}$ Ω·cm, still preferably greater than or equal to $1\times10^{12}$ Ω·cm. The value of the specific resistivity in this specification is measured at 20° C.

The size of storage capacitor formed in the liquid crystal display device is set considering the leakage current of the transistor provided in the pixel portion or the like so that charge can be held for a predetermined period. Since a transistor including an oxynitride semiconductor layer has small leakage current, it is enough to provide a storage capacitor having a capacitance that is less than or equal to ⅓, preferably less than or equal to ⅕ of a liquid crystal capacitance of each pixel.

The transistor including an oxynitride semiconductor layer used in this embodiment can have high field-effect mobility, and thus high-speed operation is possible. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally-black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an ASV mode, and the like can be given. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

In addition, as a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may be different between respective dots of color elements. The present invention is not limited to the application to a display device for color display but can also be applied to a display device for monochrome display.

Alternatively, as the display element included in the display device, a light-emitting element utilizing electroluminescence can be used. Light-emitting elements using electroluminescence are categorized by whether a light-emitting material is an organic compound or an inorganic compound, and in general, the former is called an organic EL element and the latter is called an inorganic EL element.

In an organic EL element, by application of voltage to a light-emitting element, electrons and holes are separately injected from a pair of electrodes into a layer containing a light-emitting organic compound, so that current flows. Then, recombination of these carriers (the electrons and holes) makes the light-emitting organic compound to form an excited state and to emit light when it returns from the excited state to a ground state. Because of such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device in which a light-emitting element is used as a display element will be illustrated in FIG. 10. A light-emitting element 243 which is a display element is electrically connected to the transistor 210 provided in the pixel portion 202. Note that the structure of the light-emitting element 243 is, but not limited to, a stacked structure which includes the first electrode 230, a light-emitting layer 241, and the second electrode 231. The structure of the light-emitting element 243 can be changed as appropriate depending on the direction in which light is extracted from the light-emitting element 243, or the like.

A partition 240 can be formed using an organic insulating material or an inorganic insulating material. It is particularly preferable that the partition 240 be formed using a photosensitive resin material to have an opening over the first electrode 230 so that a sidewall of the opening has a tilted surface with continuous curvature.

The light-emitting layer 241 may be formed using either a single layer or a stack of plural layers.

In order to prevent oxygen, hydrogen, moisture, carbon dioxide, and the like from entering the light-emitting element 243, a protective layer may be formed over the second electrode 231 and the partition 240. As the protective layer, a silicon nitride layer, a silicon nitride oxide layer, a DLC layer, or the like can be formed. In addition, in a space which is formed with the first substrate 201, the second substrate 206, and the sealant 205, a filler 244 is provided for sealing. In such a manner, it is preferable that the light-emitting element be packaged (sealed) with a protective film (such as a laminate film or an ultraviolet curable resin film) or a cover material with high air-tightness and little degasification so that the light-emitting element is not exposed to the outside air.

As the filler 244, an ultraviolet curable resin or a thermosetting resin can be used in addition to an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection layer. For example, anti-glare treatment by which reflected light can be diffused by projections and depressions on the surface so as to reduce the glare can be performed.

Further, electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode and a second electrode which are electrodes used for a display element, and a potential difference is generated between the first electrode and the second electrode to control orientation of the spherical particles, so that display is performed.

FIG. 11 illustrates active matrix electronic paper as an embodiment of a semiconductor device. The electronic paper in FIG. 11 is an example of a display device using a twisting ball display system.

Between the first electrode 230 connected to the transistor 210 and the second electrode 231 provided for the second substrate 206, spherical particles 253 each of which includes a black region 255a, a white region 255b, and a cavity 252 which is filled with liquid around the black region 255a and the white region 255b, are provided. A space around the spherical particles 253 is filled with a filler 254 such as a resin. The second electrode 231 corresponds to a common electrode (counter electrode). The second electrode 231 is electrically connected to a common potential line.

Note that in FIG. 9 to FIG. 11, a flexible substrate as well as a glass substrate can be used as first substrate 201 and the second substrate 206. For example, a plastic substrate having light-transmitting properties can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating layer 221 can be formed using an inorganic insulating material or an organic insulating material. Note that the insulating layer 221 formed using a heat-resistant organic insulating material such as an acrylic resin, polyimide, a benzocyclobutene resin, polyamide, or an epoxy resin is preferably used as a planarizing insulating layer. As well as such organic insulating materials, it is possible to use a low-dielectric constant material (a low-k material), a siloxane-based resin, phosphosilicate glass (PSG), borophosphosilicate glass (BPSG), or the like. Note that the insulating layer 221 may be formed by stacking a plurality of insulating layers formed using any of these materials.

There is no particular limitation on the method for forming the insulating layer 221, and the insulating layer 221 can be formed, depending on the material, by a sputtering method, a spin coating method, a dipping method, spray coating, a droplet discharge method (e.g., an inkjet method, screen printing, or offset printing), roll coating, curtain coating, knife coating, or the like.

The display device performs display by transmitting light from a light source or a display element. Therefore, the substrate and the thin films such as the insulating layer and the conductive layer provided for the pixel portion where light is transmitted have light-transmitting properties with respect to light in the visible-light wavelength range.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 230 and the second electrode 231 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The first electrode 230 and the second electrode 231 each can be formed using one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

The first electrode 230 and the second electrode 231 can be formed using a conductive composition including a conductive high molecule (also referred to as a conductive polymer). As the conductive high molecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken due to static electricity or the like, a protective circuit for protecting the driver circuit is preferably provided. The protective circuit is preferably formed using a nonlinear element.

As described above, by using the transistor described in Embodiment 1, a semiconductor device having a high on characteristics can be provided with low-temperature process and low cost. Note that the transistor described in Embodiment 1 can be applied to not only the semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

The methods and structures described in this embodiment can be combined as appropriate with any of the methods and structures described in the other embodiments.

[Embodiment 3]

A semiconductor device which is an embodiment of the present invention can be applied to a variety of electronic appliances (including game machines). Examples of electronic appliances include a television set (also referred to as a television or a television receiver), a monitor of a computer or the like, a camera such as a digital camera or a digital video camera, a digital photo frame, a mobile phone set (also referred to as a mobile phone or a mobile phone device), a portable game console, a portable information terminal, an audio reproducing device, a large-sized game machine such as a pachinko machine, and the like. Examples of electronic appliances each including the semiconductor device described in the above embodiment will be described.

Figure 12A:
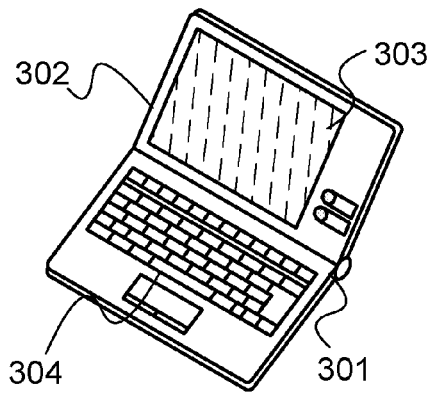
FIGS. 12A to 12E each illustrate an electronic appliance as a semiconductor device that is one embodiment of the present invention.

FIG. 12A illustrates an example of a notebook personal computer including a main body 301, a housing 302, a display portion 303, a keyboard 304, and the like. By applying the semiconductor device described in Embodiment 1 or 2, the notebook personal computer can be formed with low cost.

Figure 12B:
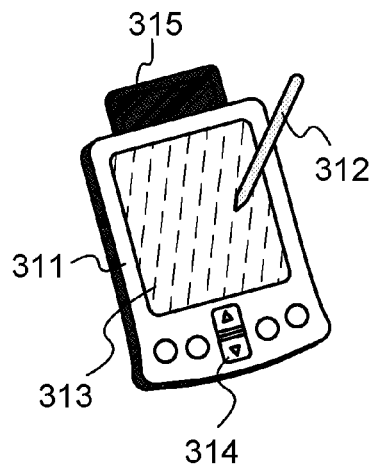

FIG. 12B illustrates an example of a personal digital assistant (PDA) including a main body 311 provided with a display portion 313, an external interface 315, operational keys 314, and the like. A stylus 312 is included as an accessory for operation. By applying the semiconductor device described in Embodiment 1 or 2, the personal digital assistant (PDA) can be formed with lower cost.

Figure 12C:
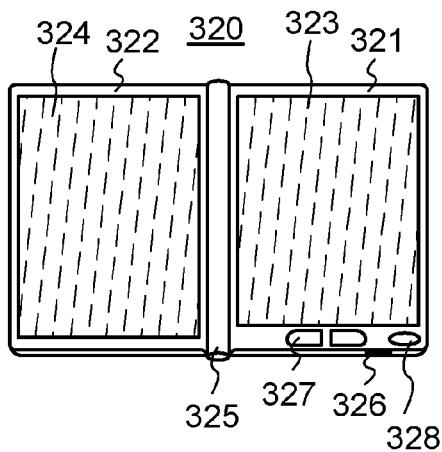

FIG. 12C is an example of an e-book reader. For example, an e-book reader 320 includes two housings: a housing 321 and a housing 322. The housing 321 and the housing 322 are combined with a hinge 325 so that the e-book reader 320 can be opened and closed with the hinge 325 as an axis. With such a structure, the e-book reader 320 can operate like a paper book.

A display portion 323 is incorporated in the housing 321 and a display portion 324 is incorporated in the housing 322. The display portion 323 and the display portion 324 may be configured to display one image or different images. In the case where the display portion 323 and the display portion 324 display different images, for example, a display portion on the right side (the display portion 323 in FIG. 12C) can display text and a display portion on the left side (the display portion 324 in FIG. 12C) can display graphics. The semiconductor device described in Embodiment 1 or 2 is applied, whereby the e-book reader can be formed with low cost.

FIG. 12C illustrates the case where the housing 321 includes an operating portion and the like. For example, the housing 321 includes a power button 326, a control key 327, a speaker 328, and the like. With the operation key 327, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader 320 may have a function of an electronic dictionary.

The e-book reader 320 may send and receive data wirelessly. Through wireless communication, desired book data or the like can be purchased and downloaded from an electronic book server.

Figure 12D:
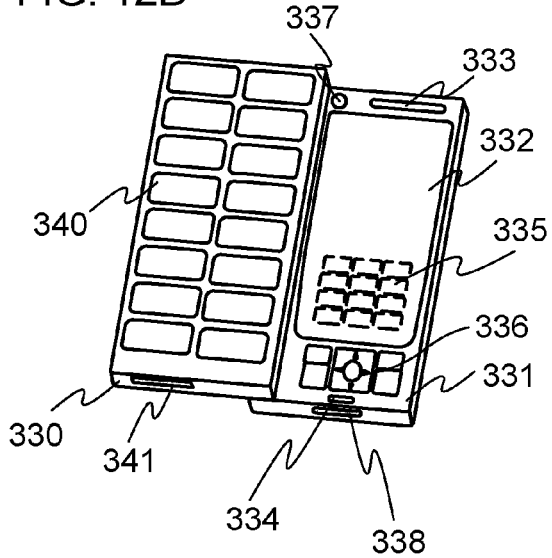

FIG. 12D illustrates an example of a mobile phone including two housings, a housing 330 and a housing 331. The housing 331 includes a display panel 332, a speaker 333, a microphone 334, a pointing device 336, a camera lens 337, an external connection terminal 338, and the like. The housing 330 is provided with a solar cell 340 for charging the mobile phone, an external memory slot 341, and the like. Further, an antenna is incorporated in the housing 331. By applying the semiconductor device described in Embodiment 1 or 2, the mobile phone can be formed with low cost.

Further, the display panel 332 is provided with a touch screen. A plurality of operation keys 335 which is displayed is indicated by dashed lines in FIG. 12D. Note that a boosting circuit by which a voltage output from the solar cell 340 is increased to be sufficiently high for each circuit is also included.

The display orientation of the display panel 332 changes as appropriate in accordance with the application mode. Further, the camera lens 337 is provided on the same surface as the display panel 332, and thus it can be used as a video phone. The speaker 333 and the microphone 334 can be used for videophone calls, recording and playing sound, and the like as well as voice calls. The housing 330 and the housing 331 in a state where they are developed as illustrated in FIG. 12D can be slid so that one is lapped over the other. Therefore, the size of the mobile phone set can be reduced, which makes the mobile phone set suitable for being carried around.

The external connection terminal 338 can be connected to an AC adapter and various types of cables such as a USB cable, and charging and data communication with a personal computer are possible. Moreover, a larger amount of data can be saved and moved by inserting a recording medium to the external memory slot 341.

Further, in addition to the above functions, an infrared communication function, a television reception function, or the like may be provided.

Figure 12E:
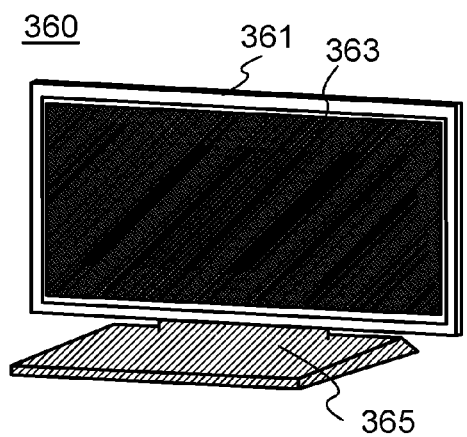

FIG. 12E illustrates an example of a television set. In a television set 360, a display portion 363 is incorporated in a housing 361. Images can be displayed on the display portion 363. Here, the housing 361 is supported on a stand 365. By applying the semiconductor device described in Embodiment 1 or 2, the television set 360 can be formed with low cost.

The television set 360 can be operated by an operation switch provided for the housing 361 or a separate remote controller. Further, the remote controller may be provided with a display portion for displaying data output from the remote controller Note that the television set 360 is provided with a receiver, a modem, and the like. Moreover, when the display device is connected to a communication network with or without wires via the modem, one-way (from a sender to a receiver) or two-way (between a sender and a receiver or between receivers) information communication can be performed.

The methods and structures described in this embodiment can be combined as appropriate with any of the methods and structures described in the other embodiments.

EXAMPLE 1

In this example, a transistor manufactured according to an embodiment of the present invention will be described.

Figure 13:
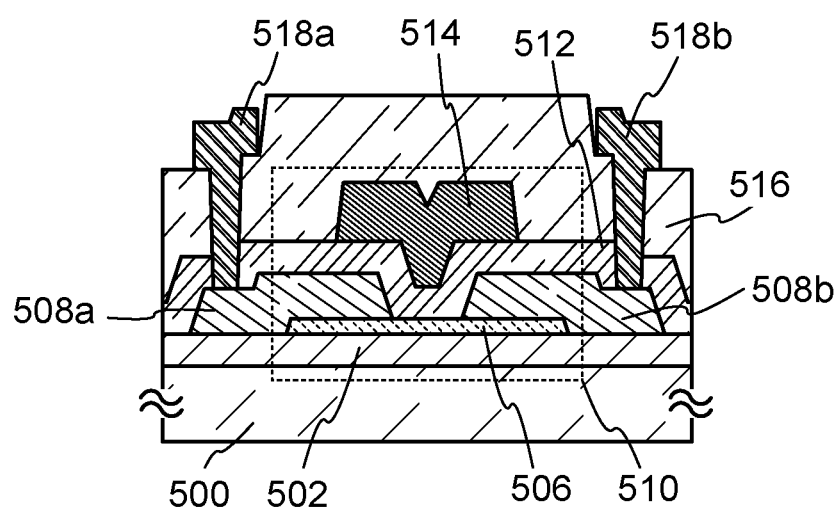
FIG. 13 illustrates one mode of a semiconductor device that is one embodiment of the present invention.

FIG. 13 illustrates the structure of the transistor in this example.

A transistor 510 illustrated in FIG. 13 includes a base insulating layer 502 provided over a substrate 500; an oxynitride semiconductor layer 506; a source electrode 508*a* and a drain electrode 508*b*; a gate insulating layer 512 provided over the source electrode 508*a* and the drain electrode 508*b*; a gate electrode 514 provided over the gate insulating layer 512; a protective insulating layer 516 provided over the gate electrode 514; and a source wiring 518*a* and a drain wiring 518*b* connected to the source electrode 508*a* and the drain electrode 508*b* respectively, with the protective insulating layer 516 provided therebetween.

In this example, a glass substrate with a thickness of 0.7 mm was used as the substrate 500; a silicon oxide layer with a thickness of 300 nm was formed as the base insulating layer 502; an In—Ga—Zn—O—N-based non-single-crystal layer with a thickness of 50 nm was formed as the oxynitride semiconductor layer 506; a titanium layer with a thickness of 150 nm was formed as the source electrode 508*a* and the drain electrode 508*b*; a silicon oxide layer with a thickness of 200 nm was formed as the gate insulating layer 512; a titanium layer with a thickness of 300 nm was formed as the gate electrode 514; a silicon oxide layer with a thickness of 300 nm was formed as the protective insulating layer 516; and a titanium layer, an aluminum layer, and a titanium layer with their respective thicknesses of 50 nm, 100 nm, and 5 nm were stacked as the source wiring 518*a* and the drain wiring 518*b*.

The oxynitride semiconductor layer 506 in the transistor 510 of this example is formed by a sputtering method in an atmosphere containing nitrogen with the use of an In—Ga—Zn—O-based metal oxide target. Therefore, sufficient on characteristics can be obtained even without heat treatment.

Formation conditions of the oxynitride semiconductor layer 506 in the transistor 510 of the example are described below. The nitrogen concentration in the oxynitride semiconductor layer 506 which was manufactured in these conditions is approximately 6.5 atomic %. Note that concentration analysis was performed by an electron probe micro analyzer (EPMA).

Figure 14A:
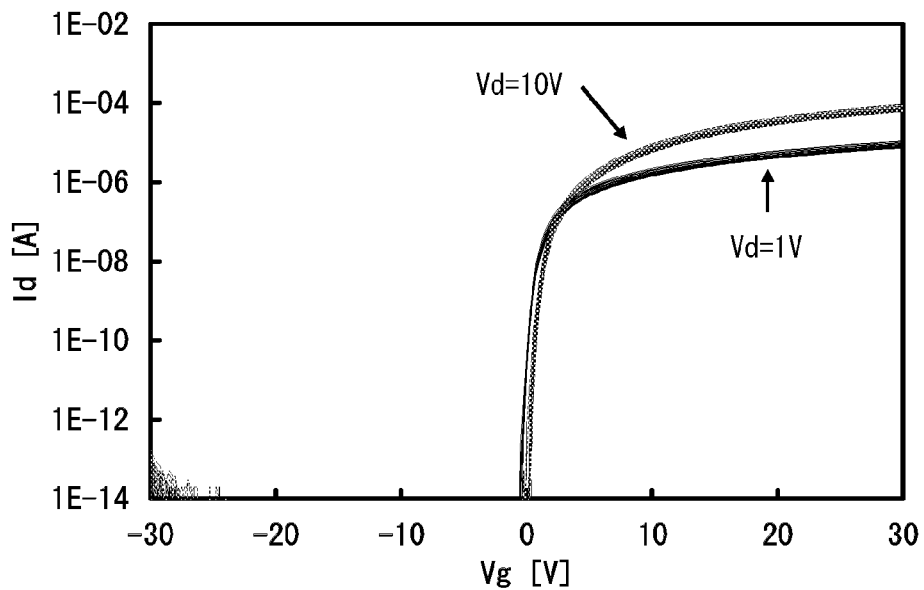
FIGS. 14A and 14B are graphs each showing electric characteristics of a thin film transistor.

Deposition method: DC sputtering method
Composition ratio of target: (In:Ga:Zn=1:1:0.5)
Deposition gas: Ar (35 sccm), and $N_2$ (5 sccm)
Power: 0.5 kW (DC)
Pressure: 0.4 Pa
T-S distance: 60 mm
Substrate temperature: room temperature Measurement results of drain current (Id)-gate voltage (Vg) in the transistor 510 of this example are shown in FIG. 14A. The measurement results of the 25 points at a surface of the substrate are all shown together in FIG. 14A. The channel length L is 10 μm and the channel width W is 50 μm. Note that a voltage Vd between the source electrode and the drain electrode of the transistor was 1 V and 10 V.

FIG. 14A shows that the transistor 510 of this example can have favorable on characteristics.

On the other hand, a transistor as a comparative example was manufactured in the same conditions as those described above except that the active layer was formed using an oxide semiconductor layer, and heat treatment at 350° C. was performed after the formation of the active layer. Formation conditions of the active layer are described below. In addition, the measurement results of drain current (Id)-gate voltage (Vg) in the transistor are shown in FIG. 14B.

Deposition method: DC sputtering method
Composition ratio of target: (In:Ga:Zn=1:1:0.5)
Deposition gas: Ar (30 sccm), and $O_2$ (15 sccm)
Power: 0.5 kW (DC)
Pressure: 0.4 Pa
T-S distance: 60 mm
Substrate temperature: room temperature In addition, the carrier density of the oxide semiconductor shown in FIG. 14B was measured by Hall effect measurement. As a result, it was found that the carrier density was approximately $2\times10^{13}$ cm$^{-3}$ after formation of the oxide semiconductor layer, and was increased to approximately $2\times10^{17}$ cm$^{-3}$ by the heat treatment at 350° C. Although not described in this specification, on characteristics cannot be obtained in the case where a transistor is manufactured in such a manner that an oxide semiconductor layer which is not subjected to heat treatment is used for an active layer. However, as shown in FIG. 14B, when the carrier density of the oxide semiconductor layer is increased by heat treatment, on characteristics of the transistor can be obtained.

Figure 14B:
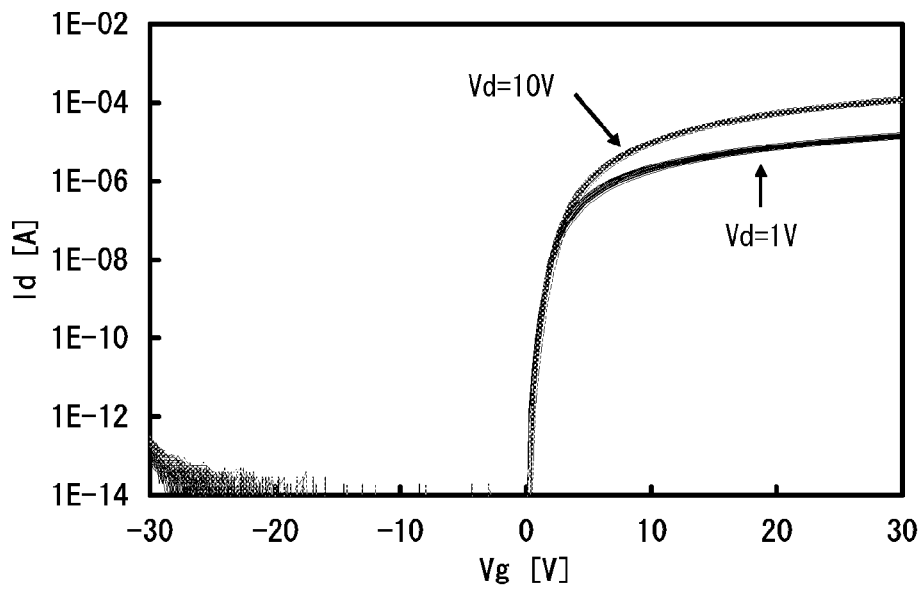

It can be found from the results of FIGS. 14A and 14B that the transistor shown in FIG. 14A, in which the oxynitride semiconductor layer was used for the active layer, and the transistor shown in FIG. 14B, which was manufactured in such a manner that heat treatment was performed on the oxide semiconductor layer, have equivalent characteristics; and the carrier density of the oxynitride semiconductor layer used for the transistor shown in FIG. 14A is sufficient for obtaining on characteristics.

As described above, it was found that even in the case where the transistor 510 of this example was manufactured without heat treatment, on current was large and favorable transistor characteristics were obtained.

This application is based on Japanese Patent Application serial No. 2010-248379 filed with Japan Patent Office on Nov. 5, 2010, the entire contents of which are hereby incorporated by reference.

What is claimed is:

1. A semiconductor device comprising:
   a semiconductor layer including a channel region, the channel region comprising indium, zinc, oxygen and nitrogen, wherein the semiconductor layer is formed on an insulating film comprising silicon oxide where an amount of released oxygen converted to oxygen atoms in thermal desorption spectroscopy is greater than or equal to $1.0 \times 10^{20}$ atoms/cm$^3$;
   a gate electrode;
   a gate insulating layer between the gate electrode and the semiconductor layer; and
   a source electrode and a drain electrode electrically connected to the semiconductor layer.

2. The semiconductor device according to claim 1, wherein the source electrode and the drain electrode are between the semiconductor layer and the gate insulating layer.

3. The semiconductor device according to claim 1, wherein the semiconductor layer is between the source electrode and the gate insulating layer and between the drain electrode and the gate insulating layer.

4. The semiconductor device according to claim 1, wherein the semiconductor layer further includes Ga.

5. The semiconductor device according to claim 1, wherein a concentration of nitrogen contained in the semiconductor layer is greater than or equal to 0.1 atomic % and less than or equal to 30 atomic %.

6. The semiconductor device according to claim 1, wherein the semiconductor device is one selected from the group consisting of a personal computer, a personal digital assistant, an e-book reader, a mobile phone and a television set.

7. A semiconductor device comprising:
   a semiconductor layer including a channel region, the channel region including indium, zinc, oxygen and nitrogen, wherein the semiconductor layer is formed on an insulating film comprising silicon oxide where an amount of released oxygen converted to oxygen atoms in thermal desorption spectroscopy is greater than or equal to $1.0 \times 10^{20}$ atoms/cm$^3$;
   an insulating layer over the semiconductor layer, wherein the insulating layer contacts a portion of an upper surface of the semiconductor layer;
   a source electrode and a drain electrode over the insulating layer; and
   a gate electrode over the channel region with a gate insulating layer therebetween.

8. The semiconductor device according to claim 7, wherein the semiconductor device is one selected from the group consisting of a personal computer, a personal digital assistant, an e-book reader, a mobile phone and a television set.

9. The semiconductor device according to claim 7, wherein a concentration of nitrogen contained in the semiconductor layer is greater than or equal to 0.1 atomic % and less than or equal to 30 atomic %.

10. The semiconductor device according to claim 7, wherein the semiconductor layer further includes Ga.

11. A semiconductor device comprising:
    a semiconductor layer including a channel region, a drain region and a source region, the channel region including indium, zinc, oxygen and nitrogen, wherein the semiconductor layer is formed on an insulating film comprising silicon oxide where an amount of released oxygen converted to oxygen atoms in thermal desorption spectroscopy is greater than or equal to $1.0 \times 10^{20}$ atoms/cm$^3$;
    a gate insulating layer over the semiconductor layer; and
    a gate electrode over the channel region with the gate insulating layer therebetween,
    wherein the source region and the drain region include a dopant, and
    wherein side edges of the gate electrode are substantially aligned with side edges of the source region and the drain region.

12. The semiconductor device according to claim 11, wherein a concentration of nitrogen contained in the semiconductor layer is greater than or equal to 0.1 atomic % and less than or equal to 30 atomic %.

13. The semiconductor device according to claim 11, wherein the semiconductor layer further includes Ga.

14. The semiconductor device according to claim 11, wherein the semiconductor device is one selected from the group consisting of a personal computer, a personal digital assistant, an e-book reader, a mobile phone and a television set.

15. The semiconductor device according to claim 11, wherein the dopant includes phosphorus.

16. The semiconductor device according to claim 11, wherein the dopant includes boron.

17. The semiconductor device according to claim 11, further comprising:
    an insulating layer over the gate electrode;
    a source electrode over the insulating layer, wherein the source electrode is in contact with the source region through a first contact hole of the insulating layer; and
    a drain electrode over the insulating layer, wherein the drain electrode is in contact with the drain region through a second contact hole of the insulating layer.

* * * * *